United States Patent
Lee

(10) Patent No.: US 7,876,101 B2
(45) Date of Patent: Jan. 25, 2011

(54) ACTIVE RADIO FREQUENCY COIL PROVIDING NEGATIVE RESISTANCE FOR HIGH FIELD MAGNETIC RESONANCE IMAGING

(75) Inventor: Ray F. Lee, New York, NY (US)

(73) Assignee: New York University, New York, NY (US)

(*) Notice: Subject to any disclaimer, the term of this patent is extended or adjusted under 35 U.S.C. 154(b) by 104 days.

(21) Appl. No.: 10/592,174

(22) PCT Filed: Mar. 7, 2005

(86) PCT No.: PCT/US2005/007606

§ 371 (c)(1),
(2), (4) Date: Sep. 8, 2006

(87) PCT Pub. No.: WO2005/086817

PCT Pub. Date: Sep. 22, 2005

(65) Prior Publication Data

US 2007/0146104 A1    Jun. 28, 2007

(51) Int. Cl.
*G01V 3/00* (2006.01)

(52) U.S. Cl. .................. 324/322; 324/318

(58) Field of Classification Search ........ 324/318–322, 324/300–317; 335/4, 296–306; 331/96; 340/854.9
See application file for complete search history.

(56) References Cited

U.S. PATENT DOCUMENTS

| | | | | |
|---|---|---|---|---|
| 2,785,371 A | * | 3/1957 | Terry et al. | 363/49 |
| 3,103,623 A | * | 9/1963 | Greenwood, Jr. | 324/302 |
| 3,174,099 A | * | 3/1965 | Larson | 324/310 |
| 3,443,208 A | * | 5/1969 | Ruddock et al. | 324/304 |
| 3,515,981 A | * | 6/1970 | Tong et al. | 324/310 |
| 3,548,110 A | * | 12/1970 | Lundkvist | 340/825.36 |
| 4,087,738 A | * | 5/1978 | Van Degrift et al. | 324/322 |
| 4,613,818 A | | 9/1986 | Battocletti et al. | 324/306 |
| 4,626,800 A | * | 12/1986 | Murakami et al. | 331/96 |
| 4,782,298 A | * | 11/1988 | Arakawa et al. | 324/322 |
| 4,793,356 A | | 12/1988 | Misic et al. | 600/422 |

(Continued)

FOREIGN PATENT DOCUMENTS

WO    WO 2005086817 A2 *  9/2005

OTHER PUBLICATIONS

Mantena, Niladiri R. et al., "Circuit Model Simulation of Gunn Effect Devices" IEEE Transactions of Microwave Theory and Techniques, vol. MTT-17, No. 7, Jul. 1969.

(Continued)

*Primary Examiner*—Melissa J Koval
*Assistant Examiner*—Tiffany A Fetzner
(74) *Attorney, Agent, or Firm*—Dorsey & Whitney, LLP

(57) ABSTRACT

As the static magnetic field used in Magnetic Resonance Imaging ("MRI") instruments increases the resonance frequency also increases. Consequently, the signal lost due to the coil becomes an issue. To compensate for this loss, it is possible to use an active device, such as a diode, a transistor, etc., with the radio frequency coil, MRI arrangement and method according to exemplary embodiments of the present invention to generate negative resistance to cancel the coil loss resistance. In this manner, the efficiency of the RF coil at high frequency can be improved.

48 Claims, 4 Drawing Sheets

U.S. PATENT DOCUMENTS

| | | | |
|---|---|---|---|
| 5,461,314 A | 10/1995 | Arakawa et al. | 324/318 |
| 5,565,779 A | 10/1996 | Arakawa et al. | 324/318 |
| 5,721,490 A * | 2/1998 | Takano et al. | 324/322 |
| 6,236,205 B1 * | 5/2001 | Ludeke et al. | 324/318 |
| 6,501,274 B1 | 12/2002 | Ledden | 324/318 |
| 6,900,638 B1 * | 5/2005 | Yair et al. | 324/322 |
| 6,930,483 B2 * | 8/2005 | Sabate et al. | 324/322 |
| 7,030,704 B2 * | 4/2006 | White | 331/3 |
| 7,800,368 B2 * | 9/2010 | Vaughan et al. | 324/318 |
| 2005/0024056 A1 * | 2/2005 | Sabate et al. | 324/322 |
| 2005/0088248 A1 * | 4/2005 | White | 331/94.1 |
| 2005/0090732 A1 * | 4/2005 | Ivkov et al. | 600/411 |
| 2007/0146104 A1 * | 6/2007 | Lee | 335/4 |
| 2008/0129298 A1 * | 6/2008 | Vaughan et al. | 324/322 |
| 2010/0253353 A1 * | 10/2010 | Cork et al. | 324/318 |
| 2010/0264917 A1 * | 10/2010 | Budker et al. | 324/307 |

OTHER PUBLICATIONS

Karacaoglu, U. et al., "A Dual-Mode Microstrip Ring Resonator Filter with Active Devices for Loss Compensation" IEEE, MTT-S Digest, 1993.

Adams, David K., et al. "Active Filters for UHF and Microwave Frequencies" IEEE Transactions on Microwave Theory and Techniques, vol. MTT-17, No. 9, Sep. 1969.

Karacaoglu, Ulun, et al. "MMIC Active Bandpass Filters using Varactor-Tuned Negative Resistance Elements" IEEE Transactions on Microwave Theory and Techniques, vol. 43, No. 12, Dec. 1995.

* cited by examiner

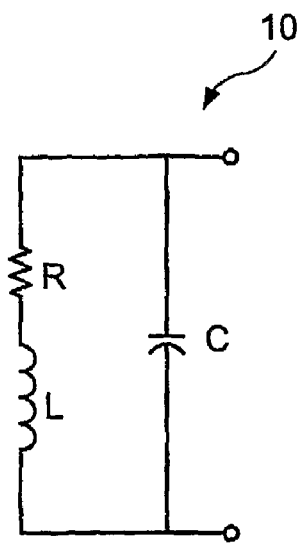
F I G. 1
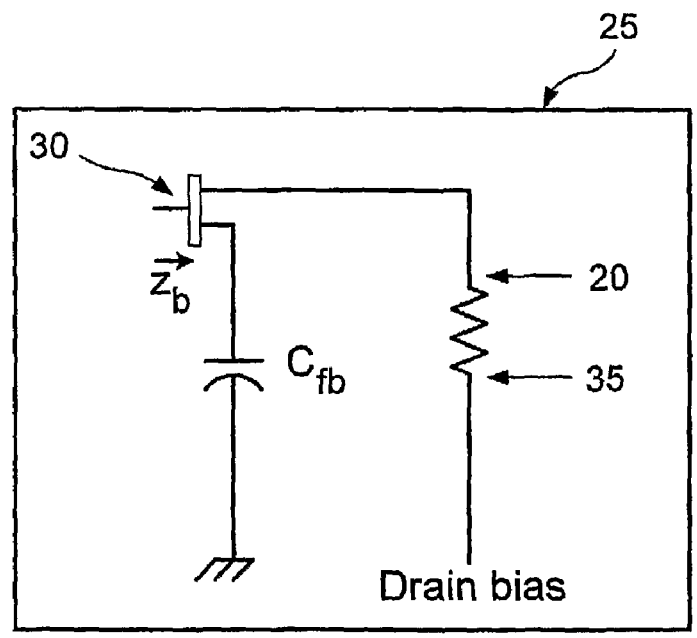
F I G. 2

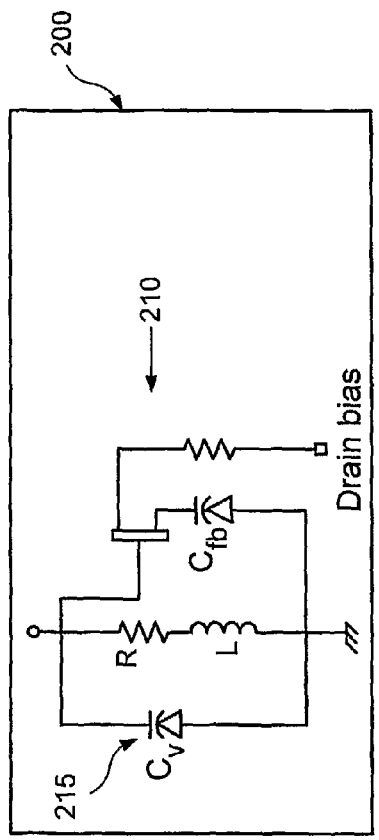
FIG. 4
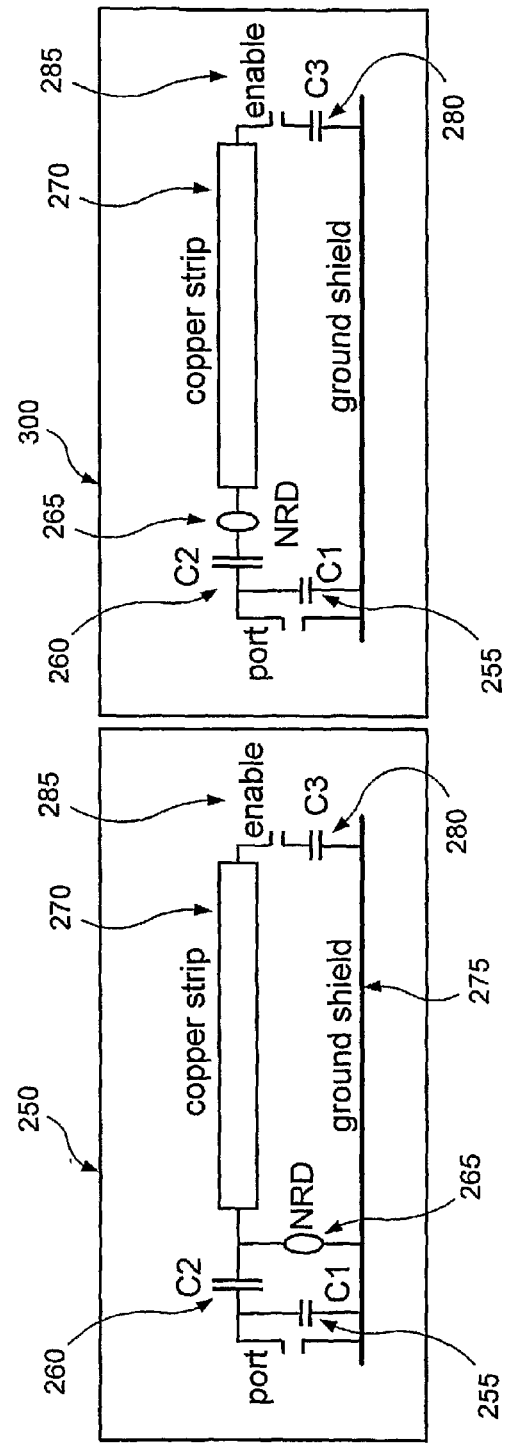
FIG. 5A
FIG. 5B

ACTIVE RADIO FREQUENCY COIL PROVIDING NEGATIVE RESISTANCE FOR HIGH FIELD MAGNETIC RESONANCE IMAGING

CROSS-REFERENCE TO RELATED APPLICATION

The present application claims priority from U.S. Patent Application No. 60/551,145, filed Mar. 8, 2004, the entire disclosure of which is incorporated herein by reference.

BACKGROUND OF THE INVENTION

Using a magnetic resonance imaging ("MRI") system, a substantially uniform main magnetic field is usually generated within an examination region. The main magnetic field polarizes the nuclear spin system of a subject (or a portion thereof) being imaged within the examination region. Magnetic resonance is excited in dipoles which align with the main magnetic field by transmitting radio frequency excitation signals into the examination region. Conventionally, radio frequency pulses that are transmitted via a radio frequency ("RF") coil assembly move the dipoles out of alignment with the main magnetic field, and cause a macroscopic magnetic moment vector to precess around an axis parallel to the main magnetic field. Then, a corresponding radio frequency magnetic signal is generated. The RF magnetic resonance signal is received by the RF coil assembly, and from the received RF signals, an image representation can be reconstructed for display, and/or data obtained for other purposes.

Intrinsic signal-to-noise ratio ("SNR") of the MRI system can be proportional to the static magnetic field. The MRI technology development is moving towards higher static magnetic fields (e.g., 7 T, 8 T, or 9.4 T). However, an increase in the static magnetic field can increase the resonance frequency. Such higher resonance frequency can result in a more significant coil loss that otherwise could be neglected in a low field (e.g., 1.5 T or below). This coil loss may includes a radiation loss and a conductor loss. Thus, the efficiency of conventional passive radio frequency ("RF") coils is reduced, likely significantly, when the resonance frequency increases. Such reduction in efficiency of the conventional passive RF coils may compromise the higher SNR that is obtained by increasing the static magnetic field. One of the objects of the present invention is to address such efficiency reduction, e.g., using an active RF coil.

Previously, active devices have been used in active antenna and active filter designs. However, the use of the active devices not been significantly utilized in the conventional MRI coil designs. One of the reasons for such lack of utilization is because the sample loss (as opposed to coil loss) is dominant in common low field (1.5 T) RF detection. As the static magnetic field increases, the resonance frequency increases, and signal lost due to the coil becomes an issue, and therefore minimizing loss due to the coil is desirable.

SUMMARY OF THE INVENTION

In order to compensate for the coil loss in the high field, and in accordance with at least one of the objects and exemplary embodiments of the present invention, it is possible to use an active device (e.g., a diode, a transistor, etc.) to generate a negative resistance to cancel the coil loss resistance. In this manner, the efficiency of the RF coil at a high frequency can be improved.

According to one exemplary embodiment of the present invention, a radio frequency coil ("RF"), MRI system and method can be provided adapted for high field magnetic resonance imaging. In particular, an arrangement can be provided therefor exhibiting negative resistance characteristics. The arrangement can include a negative resistance device which has a field effect transistor. The field effect transistor can include a Metal Shottky field effect transistor ("MESFET"), a Metal Oxide Semiconductor Field Effect Transistor ("MOSFET"), a high electron mobility transistor ("HEMT") and/or a Pseudomorphic High Election Mobility Transistor ("pHEMT"). Further, the field effect transistor can include a common-gate which includes a inductive feedback device, a common-source which includes a capacitive feedback and drain output device, and a common-source which includes a capacitive feedback with gate output device.

According to another exemplary embodiment of the present invention, the arrangement can be a bipolar-junction transistor. The bipolar-junction transistor may include a NPN transistor and/or a PNP transistor. Further, the arrangement can include a diode. The diode may include a Gunn diode, an Impact Ionization Avalanche Transit-Time diode (IMPATT diode) and/or a tunnel effect diode. The arrangement can also be an operational amplifier.

According to still another exemplary embodiment of the present invention, at least one capacitor can be provided which is capable of controlling the arrangement. For example, the arrangement can be controlled using the at least one capacitor by controlling a transconductance and/or a feedback capacitance. The arrangement may be capable of exhibiting capacitive properties. The arrangement is capable of exhibiting inductive properties. In addition, the arrangement can be a negative resistance device which is shunted to a ground with a copper strip.

In a further exemplary embodiment of the present invention, a varactor may be provided which is capable of controlling the negative resistance of the arrangement.

BRIEF DESCRIPTION OF THE DRAWINGS

For a more complete understanding of the present invention and its advantages, reference is now made to the following description, taken in conjunction with the accompanying drawings, in which:

FIG. 1 is an exemplary simplified circuit diagram of an Inductance-Capacitance-Resistance ("LCR") equivalent circuit for a conventional low field RF coil;

FIG. 2 is an exemplary circuit diagram of a field-effect transistor ("FET") type negative resistance device used with an active RF coil, in accordance with one exemplary embodiment of the present invention;

FIG. 4 is an exemplary circuit diagram of a resonator circuit which includes a negative resistance device according to an exemplary embodiment of the present invention to compensate for loss due to the characteristics of the coil;

FIG. 5A is an exemplary active array element with the negative resistance device shunted to the ground shield in a front end with a copper strip according to one exemplary embodiment of the present invention; and FIG. 5b is a further exemplary active array element with the negative resistance device shunted to the ground shield in series with a copper strip according to another exemplary embodiment of the present invention.

Figure 3A:
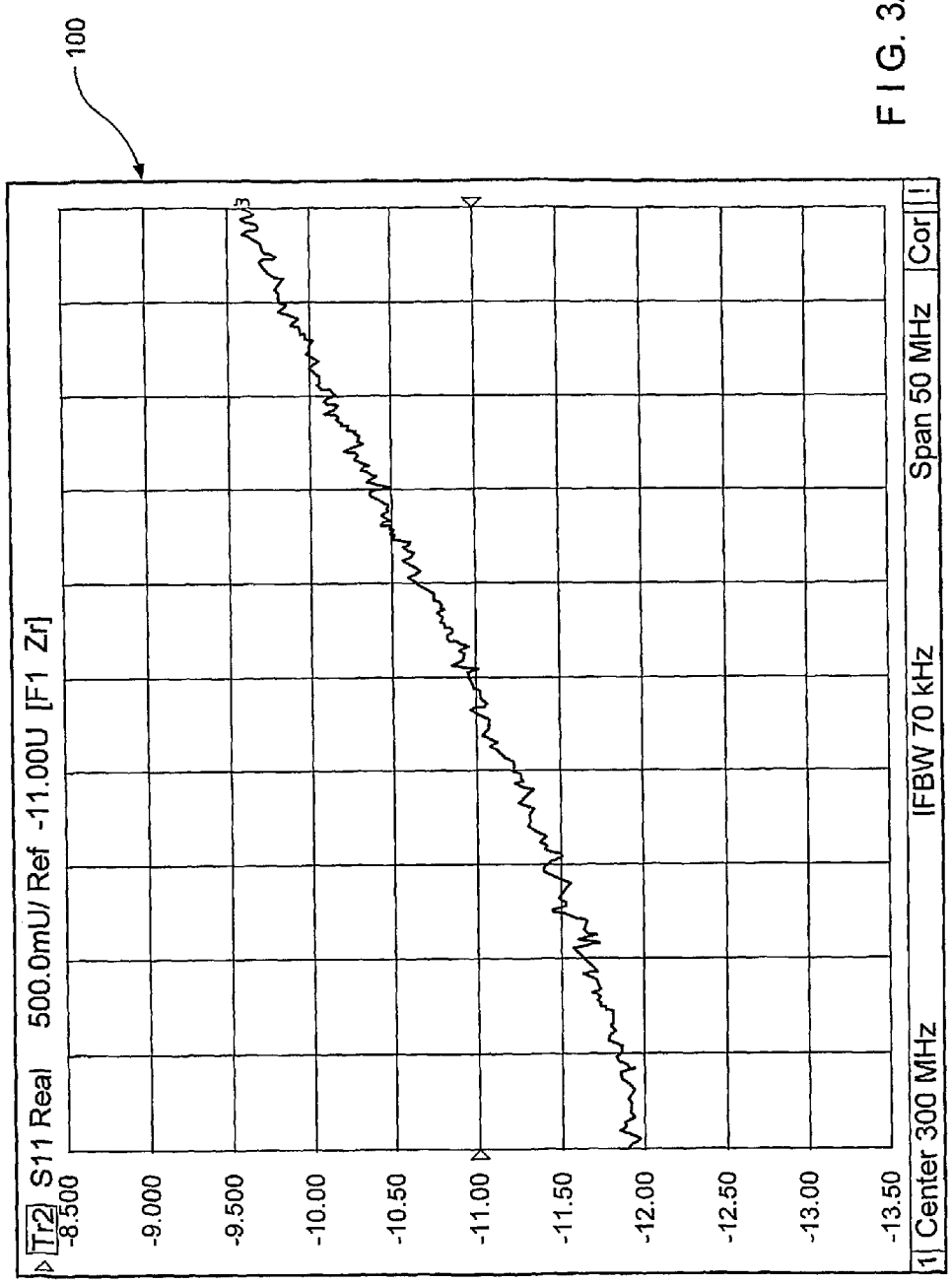
FIG. 3A is an exemplary display illustration of a real part of a negative resistance measurement of the FET negative resistance device.

Throughout the drawings, the same reference numerals and characters, unless otherwise stated, are used to denote like features, elements, components, or portions of the illustrated embodiments. Moreover, while the present invention will now be described in detail with reference to the Figures, it is done so in connection with the illustrative embodiments.

DETAILED DESCRIPTION

Conventional MRI RF coils have utilized passive resonators ("PR") which can be modeled with a variety of LCR circuits, as described in Chen C-N et al., Biomedical Magnetic Resonance Technology, Adam Hilger (1989). Although there are some active parts on various coils, such as diodes, these active parts are likely only provided for a transmit/receive ("TR") switch, and generally do not contribute to coil tuning and matching. To demonstrate the limitation of passive resonators in lossy conditions which is likely the reality in high field, it is possible to analyze a simplified circuit model for a conventional surface coil 10 (shown in FIG. 1) In this conventional coil 10, L is the inductance of copper strip, C is the tuning capacitor, and a resistor R is the sum of sample loss and coil loss. As shown in FIG. 1, the resistor R and the inductor L are provided in series, and such arrangement of the resistor R and the inductor L is provided in parallel with the capacitor C. The resonance frequency ($\omega$) and Q-factor of this circuit 10 are as follows:

$$\omega = \sqrt{\frac{1}{LC} - \frac{R^2}{L^2}}, \quad Q = \frac{\omega L}{R}. \quad [1]$$

As indicated herein above, the higher the magnetic field, the higher the coil loss. Therefore, Equation [1] indicates the following. First, when the frequency-dependent coil loss is increased to the extent that the resistance of the resistor R becomes larger than the square root of L/C, then $\omega$ becomes an imaginary number, which means that this passive LCR circuit likely cannot resonate. Second, a higher resistance of the resistor R may lead to a lower Q-factor. To avoid the diminishing consequence of high coil loss in high field, e.g., in a 7 T body coil, it is preferable to provide a negative resistance from a transistor circuit, e.g., to cancel at least a portion of the resistance, keep the resonance frequency $\omega$ from becoming an imaginary number, and maintain the coil's Q high.

The resistance of the resistor R is defined by Ohm's law R=V/I, in which V is voltage and I is current. However, various active devices, such as diodes and transistors, do not always follow Ohm's law. A more broad definition of resistance can be provided by a ratio of a differential voltage to a differential current, i.e., R=dV/dI. In general, the current tends to rise with an increasing voltage. However, for transistors and diodes, there are certain conditions where current falls as voltage rises. This can result in a negative resistance, which can be realized by, for example, (i) a Gunn Diode, (ii) an FET, or (iii) a bipolar-junction-transistor ("BJT"), as described in Mantena N.R. et al., "Circuit Model Simulation of Gunn Effect Devices," IEEE Trans. on Microwave Theory and Techniques (1969) MTT-17, p. 363, Karacaoglu U. et al., "Dual-Mode Microstrip Ring Resonator Filter with Active Devices for Loss Compensation," IEEE MTT-S International Microwave Symposium Digest (1993), pp. 189-192 ("Karacaoglu et al."), and Adams D.K. et al., "Active Filters for UHF and Microwave Frequencies," IEEE trans. on Microwave Theory and Techniques (1969) MTT-17, pp. 662-670, respectively.

One example of the negative resistance that can be obtained by utilizing the FET is shown in FIG. 2, which illustrates an exemplary circuit diagram of a field-effect transistor ("FET") type negative resistance device 20 used with an active RF coil, in accordance with one exemplary embodiment of the present invention. This device can be included as a part of the MRI system 25 and/or provided in communications with (either wired or wireless) therewith. In particular, the device includes a transistor 30, and a resistor 35 which connected to the drain terminal thereof. In addition, a capacitor $C_{fb}$ can be attached to the transistor 30 as well. For example, the impedance of the device 20 can be analyzed in Karacaoglu et al. according to formula 2.

$$Z_{in} = -\frac{g_m}{\omega^2 C_{gs} C_{fb}} - j\left(\frac{1}{\omega C_{gs}} + \frac{1}{\omega C_{fb}}\right). \quad [2]$$

In particular, $C_{gs}$ is the gate-source capacitance, $C_{fb}$ is the feed back capacitance, $g_m$ is the mutual conductance. The exemplary circuit 20 shown in FIG. 2 provides negative resistance and capacitance.

Figure 3B:
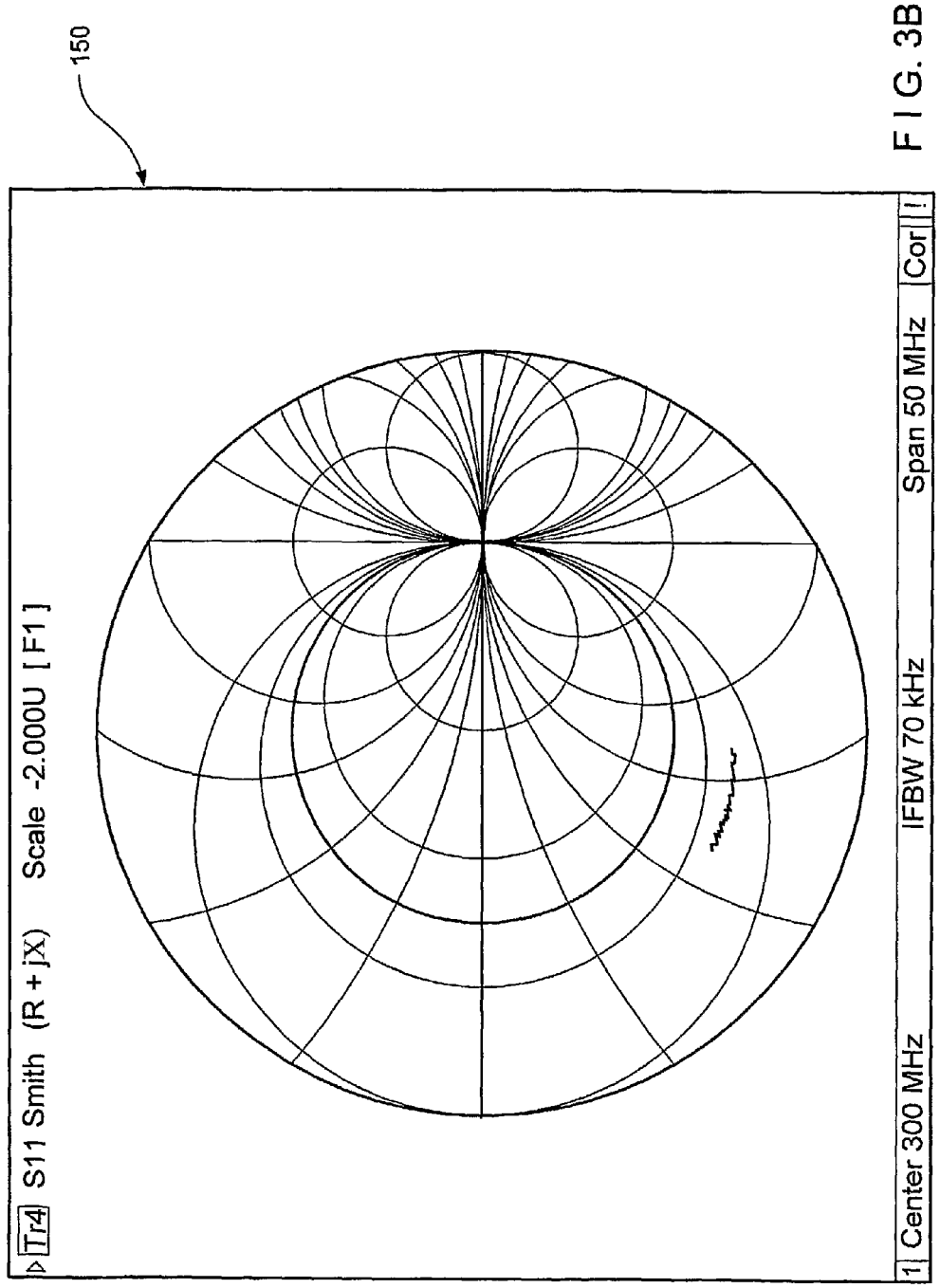
FIG. 3B is another exemplary display illustration of a negative resistance measurement of the FET negative resistance device expressed in a Smith Chart where all the measured points are provided outside of a zero resistance circle (e.g., a negative resistance)

The device 20 of FIG. 2 can be arranged to observe the negative resistance on a network analyzer, e.g., Agilent E5070B (CA). The selected FET 30 can be, e.g., ATF-34143-BLK manufactured by Agilent. The trans-conductance of this exemplary FET 30 can be $g_m$=230, and the noise value may be 0.5 dB. When the feedback capacitor $C_{fb}$ is 200 pF, the drain of the FET 30 may be DC biased and/or not biased, the gate port thereof may provide a negative resistance of −11 Ω at 300 MHz. FIG. 3A shows is an exemplary display illustration of a real part of a negative resistance (or impedance) measurement of the FET negative resistance device, it can be confirmed that the resistance of the circuit is negative, e.g., where (a) is the real part of the impedance measurement. FIG. 3B shows another exemplary display illustration of a smith chart measurement in which the measurement points may all be provided outside of zero resistance circle. Therefore, using this exemplary device 20 shown in FIG. 2 and described herein above, a desired negative resistance can be obtained. In further exemplary embodiments of the present invention, the desired negative resistance can be obtained utilizing other active devices, such as diodes and bipolar junction transistors ("BJT"). In still a further exemplary embodiments of the present invention, the active device may be selected to obtain enhanced power performance.

One having ordinary skill in the art with the benefit of this disclosure would clearly realize that other active devices may be utilized to obtain the objects, features and advantages of the present invention. For example a variety of configurations of negative resistance devices according to the present invention may be utilized at, e.g., 300 MHz at 7 T. As known by those of ordinary skill in the art, there may be three common types of solid state devices that can be used for generating negative resistance. For example, these devices may include: (a) FET which can be a Metal Shottky Field Effect Transistor ("MESFET"), a Metal Oxide Semiconductor Field Effect Transistor ("MOSFET"), a High Electron Mobility Transistor ("HEMT") and a Pseudomorphic High Electron Mobility Transistor ("pHEMT"); (b) BJT which can be either a NPN transistor or a PNP transistor; or (c) a diode, which can be Gunn diode, an Impact Ionization Avalanche Transit-Time diode ("IMPATT" diode), or a tunnel effect diode. In a further exemplary embodiment of the present invention, the negative resistance can also be realized by operational-amplifiers or certain composite materials. Each type of negative resistance device may also have a different circuit topology. For example, in the case of FET, the negative resistance device can be: (a) common-gate with inductive feedback; (b) common-source with capacitive feedback and drain output; or (c) common-source with capacitive feedback with gate output.

In a further exemplary embodiment of the present invention, the different types and topologies of the negative resistance devices may be controlled for use as part of the RF coil. For example, it may be possible to adjust the negative resistance values by varying certain portions of the negative resistance device. In particular, with reference to FIG. 2, the negative resistance of the device can be calculated using Equation [2], which indicates that the negative resistance can be adjusted by selecting different transconductance $g_m$, and/or feedback capacitance $C_{gs}$. Such controllability may provide adjustability to increase or maximize the compensation of the signal loss due to the RF coil, without becoming an oscillator.

According to another consideration for providing an optimal negative resistance device according to yet another exemplary embodiment of the present invention, an absolute value of the negative resistance may be provided to be in the vicinity of the coil loss resistance, e.g., $R_{CL}=R_r+R_c$, where $R_r$ is the radiation loss resistance and $R_c$ is the conductor loss resistance. The $R_r$ and $R_c$ can be determined analytically, based on the conductor geometry of the coil, and/or estimated experimentally. Other considerations for the exemplary design according to the present invention may include the noise considerations and power handling of the device of the present invention. In order to transmit signals, the negative resistance device's noise figure may not be crucial. However, the power tolerance and power saturation threshold should preferably be optimized. For example, it may be preferable for the power tolerance to be about 200 W for 16 channels and 100 W for 32 channels, given a maximum power output from power amplifier of 8 kW. For receiving signals, the negative resistance device's noise figure should preferably be as low as possible (e.g., less than 0.5 dB), while power handling should preferably be on the order of milliwatts (mW).

In a still further exemplary embodiment of the present invention, the Q of the resonators can be enhanced by integrating the negative resistance device to compensate the loss. Various different negative resistance circuits can be used for such purpose. As one exempla, the common-source FET negative resistance circuit 210 provided in an MRI arrangement 200 shown in FIG. 4 as a simplified equivalent circuit of a single FET active resonator may preferably be used because such circuit can utilize (or include) a varactor 215 as the source feedback element to control the negative resistance more precisely, as described, e.g., in Karacaoglu U. et al., "MMIC Active Bandpass Filters Using Varactor-Tuned Negative Resistance Elements," IEEE trans. on Microwave Theory and Techniques (1995) 43, pp. 2926-2932.

In other exemplary embodiments of the present invention, an active array element may be used as part of a high field MRI radio frequency coil. One such exemplary embodiment includes the active array element which has a negative resistance device, either (i) shunted to the ground shield in the front end, or (ii) provided in series with a copper strip, for example, as shown in FIGS. 5A and 5B, respectively. In still a further exemplary embodiment, the negative resistance device can be either inductive or capacitive depending on its topology.

For example, the exemplary embodiment shown in FIG. 5A is provided in the MRI arrangement 250, and includes a serially connected capacitors 255 (C1) and 260 (C2). This capacitor combination is connected in parallel to the negative resistance device ("NRD") 265. The combination of the capacitors 255, 260 and the NRD 265 are connected at one end to a copper strip 270, and on the other end to a ground shield 275. On an opposite end, the copper strip 270 and the ground shield 275 are connected in series to another capacitor 280 and an enable device 285. In this manner, an array element configuration can be formed which may also be used in the active filter arrangement according to the present invention, as shown in FIG. 4. In the exemplary embodiment of FIG. 5B which can also be provided in the MRI arrangement 300, the capacitors 255, 260 are provided in series with the NRD 265 (instead of in parallel as shown in FIG. 5A). Although the negative resistance of this exemplary embodiment can directly cancel the conductor loss of the copper strip 270, if the NRD 265 is inductive, it may increase the total inductance $C_{total}$, and possibly force capacitors 255 (C1) and 280 (C3) to become too small to be realistic. If the NRD 265 is capacitive, it may cause the match to become more complicated, and the exemplary device shown in FIG. 5A can be used.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. All publications and references cited above are incorporated herein by reference in their entireties.

What is claimed is:

1. A radio frequency coil configured for magnetic resonance imaging, comprising:
   a resonance circuit which is configured to perform at least one of transmitting or receiving a signal; and
   a coil configuration which is configured to provide a negative resistance to the resonance circuit in order to reduce a noise generated from the resonance circuit and configured to be used at a magnetic field of at least 7 Tesla.

2. The radio frequency coil according to claim 1, wherein the configuration includes a negative resistance device which comprises a field effect transistor.

3. The radio frequency coil according to claim 2, wherein the field effect transistor comprises at least one of a Metal Shottky field effect transistor ("MESFET"), a Metal Oxide Semiconductor Field Effect Transistor ("MOSFET"), a high electron mobility transistor ("HEMT"), or a Pseudomorphic High Electron Mobility Transistor ("pHEMT").

4. The radio frequency coil according to claim 2, wherein the field effect transistor comprises a common-gate which includes a inductive feedback device, a common-source which includes a capacitive feedback and drain output device, and a common-source which includes a capacitive feedback with gate output device.

5. The radio frequency coil according to claim 1, wherein the configuration comprises a bipolar-junction transistor.

6. The radio frequency coil according to claim 5, wherein the bipolar-junction transistor comprises at least one of a NPN transistor or a PNP transistor.

7. The radio frequency coil according to claim 1, wherein the configuration comprises a diode.

8. The radio frequency coil according to claim 7, wherein the diode comprises at least one of a Gunn diode, an Impact Ionization Avalanche Transit-Time diode (IMPATT diode), or a tunnel effect diode.

9. The radio frequency coil according to claim 1, wherein the configuration comprises an operational amplifier.

10. The radio frequency coil according to claim 1, further comprising at least one capacitor which is configured to control the configuration.

11. The radio frequency coil according to claim 10, wherein the configuration is controlled using the at least one capacitor by controlling at least one of a transconductance or a feedback capacitance.

12. The radio frequency coil according to claim 1, wherein the configuration is configured to exhibit capacitive properties.

13. The radio frequency coil according to claim 1, wherein the configuration is configured to exhibit inductive properties.

14. The radio frequency coil according to claim 1, wherein the configuration includes a negative resistance device which is shunted to a ground with a copper strip.

15. The radio frequency coil according to claim 1, further comprising a varactor which is configured to control the negative resistance of the configuration.

16. The radio frequency coil according to claim 1, wherein the resonance circuit comprises the configuration.

17. The radio frequency coil according to claim 1, wherein the resonance circuit comprises a resonator circuit.

18. The radio frequency coil according to claim 1, wherein the configuration is configured to dynamically control the negative resistance to reduce an interaction between a subject and the radio frequency coil to prevent the resonance circuit from acting substantially as an oscillator.

19. A method of providing a radio frequency coil configured for magnetic resonance imaging comprising:
   providing a resonance circuit which is configured to at least one of transmitting or receiving a signal; and
   providing a coil configuration of the radio frequency coil which is configured to provide a negative resistance to the resonance circuit in order to reduce a noise generated from the resonance circuit and configured to be used at a magnetic field of at least 7 Tesla.

20. The method according to claim 19, wherein the configuration includes a negative resistance device which comprises a field effect transistor.

21. The method according to claim 20, wherein the field effect transistor comprises at least one of a Metal Shottky field effect transistor ("MESFET"), a Metal Oxide Semiconductor Field Effect Transistor ("MOSFET"), a high electron mobility transistor ("HEMT"), or a Pseudomorphic High Electron Mobility Transistor ("pHEMT").

22. The method according to claim 20, wherein the field effect transistor comprises a common-gate which includes a inductive feedback device, a common-source which includes a capacitive feedback and drain output device, and a common-source which includes a capacitive feedback with gate output device.

23. The method according to claim 19, wherein the configuration comprises a bipolar-junction transistor.

24. The method according to claim 23, wherein the bipolar-junction transistor comprises at least one of a NPN transistor or a PNP transistor.

25. The method according to claim 19, wherein the configuration comprises a diode.

26. The method according to claim 25, wherein the diode comprises at least one of a Gunn diode, an Impact Ionization Avalanche Transit-Time diode (IMPATT diode), or a tunnel effect diode.

27. The method according to claim 19, wherein the configuration comprises an operational amplifier.

28. The method according to claim 19, further comprising:
   providing at least one capacitor which is configured to control configuration, 29. The method according to claim 28, wherein the configuration is controlled using the at least one capacitor by controlling at least one of a transconductance or a feedback capacitance.

30. The method according to claim 19, wherein the configuration is configured to exhibit capacitive properties.

31. The method according to claim 19, wherein the configuration is configured to exhibit inductive properties.

32. The method according to claim 19, wherein the configuration includes a negative resistance device which is shunted to a ground with a copper strip.

33. The method according to claim 19, further comprising a varactor which is configured to control the negative resistance of the configuration.

34. The method according to claim 19, wherein the resonance circuit comprises the configuration.

35. The method according to claim 19, wherein the resonance circuit comprises a resonator circuit.

36. The method according to claim 19, wherein the configuration is configured to dynamically control the negative resistance.

37. The method according to claim 36, wherein the negative resistance is dynamically controlled to reduce an interaction between a subject and the radio frequency coil to prevent the resonance circuit from acting substantially as an oscillator.

38. A magnetic resonance imaging system, comprising a radio frequency coil which includes:
   a resonance circuit which is configured to at least one of transmitting or receiving a signal; and
   a coil configuration which is configured to provide a negative resistance to the resonance circuit in order to reduce a noise generated from the resonance circuit and configured to be used at a magnetic field of at least 7 Tesla.

39. The system according to claim 38, wherein the resonance circuit comprises the configuration.

40. The system according to claim 38, wherein the resonance circuit comprises a resonator circuit.

41. The system according to claim 38, wherein the configuration is configured to dynamically control the negative resistance to reduce an interaction between a subject and the radio frequency coil to prevent the resonance circuit from acting substantially as an oscillator.

42. A radio frequency coil configured for magnetic resonance imaging, comprising:
   a resonance circuit which is configured to at least one of transmitting or receiving a signal; and
   a coil configuration which is configured to be used at a magnetic field of at least 7 Tesla and configured to provide a negative resistance to the resonance circuit in order to provide at least one of (i) an increase of a Q-factor associated with the radio frequency coil, (ii) a cancellation of at least a portion of a positive resistance of the resonance circuit, (iii) a reduction of a coil loss associated with the resonance circuit, or (iv) a compensation for the coil loss.

43. The radio frequency coil according to claim 42, wherein the coil loss includes at least one of a radiation loss associated with the resonance circuit or a conductor loss associated with the resonance circuit.

44. The radio frequency coil according to claim 42, wherein the configuration includes a negative resistance device which comprises at least one of (i) a field effect transistor, (ii) a bipolar-junction transistor, or (iii) a diode.

45. The radio frequency coil according to claim 42, wherein the resonance circuit comprises the configuration.

46. The system according to claim 42, wherein the resonance circuit comprises a resonator circuit.

47. The radio frequency coil according to claim 42, wherein the configuration is configured to dynamically control the negative resistance in order to reduce an interaction between a subject and the radio frequency coil in order to prevent the resonance circuit from acting substantially as an oscillator.

48. The radio frequency coil according to claim 42, wherein the configuration is further configured to provide a negative resistance to the resonance circuit in order to (i) increase the Q factor associated with the radio frequency coil, (ii) cancel at least a portion of the positive resistance of the resonance circuit, (iii) reduce the coil loss, and (iv) compensate for the coil loss, wherein the coil loss includes at least one of a radiation loss associated with the resonance circuit or a conductor loss associated with the resonance circuit.

* * * * *